United States Patent
Ranta et al.

(10) Patent No.: US 10,141,927 B2
(45) Date of Patent: *Nov. 27, 2018

(54) OPTIMIZED RF SWITCHING DEVICE ARCHITECTURE FOR IMPEDANCE CONTROL APPLICATIONS

(71) Applicant: pSemi Corporation, San Diego, CA (US)

(72) Inventors: Tero Tapio Ranta, San Diego, CA (US); Chih-Chieh Cheng, Poway, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/499,770

(22) Filed: Apr. 27, 2017

(65) Prior Publication Data

US 2017/0302272 A1    Oct. 19, 2017

Related U.S. Application Data

(63) Continuation of application No. 14/501,677, filed on Sep. 30, 2014, now Pat. No. 9,667,246.
(Continued)

(51) Int. Cl.
*H01P 1/15* (2006.01)
*H01P 1/10* (2006.01)
(Continued)

(52) U.S. Cl.
CPC ......... *H03K 17/693* (2013.01); *H03K 17/102* (2013.01); *H04B 1/48* (2013.01); *H01P 5/12* (2013.01); *Y10T 29/49105* (2015.01)

(58) Field of Classification Search
CPC ....... H01P 1/15; H03K 17/693; H03K 17/102
(Continued)

(56) References Cited

U.S. PATENT DOCUMENTS 3,317,752 A    5/1967 Zuk
3,974,486 A    8/1976 Curtis et al.
(Continued)

FOREIGN PATENT DOCUMENTS

JP    08223021    8/1996
JP    10093471    4/1998

OTHER PUBLICATIONS

Takaoka, Dean O., Office Action received from the USPTO dated Feb. 25, 2016 for U.S. Appl. No. 14/501,677, 20 pgs.
(Continued)

*Primary Examiner* — Dean Takaoka
(74) *Attorney, Agent, or Firm* — Jaquez Land Greenhaus LLP; Martin J. Jaquez, Esq.; John Land, Esq.

(57) ABSTRACT

A switch architecture having open reflective unselected ports. Signals can be selectively coupled between a common port and at least one selectable port through series connected switches. When one or more port is selected, the remaining ports are opened. In addition, associated "shuntable" switches from each of the selectable ports to ground are always open, regardless of the ON or OFF state of the series switches; thus, there is no normally active connection of the selectable ports to ground, but the presence of the shuntable switches provides electrostatic discharge protection for all ports. Embodiments of the invention allow configurability between a traditional architecture and an open reflective unselected port architecture, and include integrated circuit and field effect transistor embodiments.

23 Claims, 5 Drawing Sheets

Related U.S. Application Data

(60) Provisional application No. 61/887,224, filed on Oct. 4, 2013.

(51) Int. Cl.
*H03K 17/693* (2006.01)
*H03K 17/10* (2006.01)
*H04B 1/48* (2006.01)
*H01P 5/12* (2006.01)

(58) Field of Classification Search
USPC .......................................................... 333/103
See application file for complete search history.

(56) References Cited

U.S. PATENT DOCUMENTS

| | | | |
|---|---|---|---|
| 5,774,792 A | 6/1998 | Tanaka et al. | |
| 5,917,362 A | 6/1999 | Kohama | |
| 7,265,604 B2 | 9/2007 | Yasuda et al. | |
| 9,667,246 B2 * | 5/2017 | Ranta | H03K 17/693 |
| 2007/0120619 A1 * | 5/2007 | Kearns | H01P 1/15 |
| | | | 333/103 |
| 2013/0015717 A1 | 1/2013 | Dykstra | |
| 2014/0220909 A1 | 8/2014 | Kunishi et al. | |

OTHER PUBLICATIONS

Takaoka, Dean O., Final Office Action received from the USPTO dated Aug. 12, 2016 for U.S. Appl. No. 14/501,677, 25 pgs.
Takaoka, Dean O., Notice of Allowance received from the USPTO dated Feb. 10, 2017 for U.S. Appl. No. 14/501,677, 7 pgs.
Ranta, et al., Amendment filed in the USPTO dated May 25, 2016 for U.S. Appl. No. 14/501,577, 20 pgs.
Ranta, et al., Amendment After Final Office Action filed in the USPTO dated Oct. 12, 2016 for U.S. Appl. No. 14/501,577, 18 pgs.

* cited by examiner

OPTIMIZED RF SWITCHING DEVICE ARCHITECTURE FOR IMPEDANCE CONTROL APPLICATIONS

CROSS-REFERENCE TO RELATED APPLICATIONS

This patent application is a continuation application of U.S. patent application Ser. No. 14/501,677 filed Sep. 30, 2014 entitled "Optimized RF Switching Device Architecture for Impedance Control Applications", the disclosure of which is incorporated herein by reference in its entirety; and application Ser. No. 14/501,677 claims the benefit of priority from U.S. Provisional Patent Application No. 61/887,224, filed Oct. 4, 2013, entitled "Optimized RF Switching Device Architecture for Impedance Control Applications", the entire disclosure of which is hereby incorporated by reference.

BACKGROUND (1) Technical Field

This invention generally relates to electronic circuitry, and more specifically to switching devices particularly suited for use with radio frequency (RF) field effect transistors (FETs).

(2) Background

Electronic circuitry often uses FETs as electrical switches, resistors, and/or capacitors. One such usage of FETs is in integrated circuit RF switches. An RF switch is a device to route RF signals through transmission paths, such as between an antenna and multiple transceivers in a radio system; an example of such a radio system is a cellular telephone.

FIG. 1 is a schematic diagram of a typical prior art RF single-pole, multiple-throw switch circuit 100. Radio frequency signals can be selectively coupled between a common connection port RFC and at least two selectable RF ports (four such ports, RF1-RF4, are shown). The common connection port RFC is typically connected to an antenna (either directly or through additional circuitry, such as RF filters). The selectable RF ports RF1-RF4 are typically used to connect the RFC port to other circuitry (not shown), such as RF transceivers (again, either directly or through additional circuitry).

In operation, if selectable port RF1 is selected to be coupled to the RFC port, then an associated series switch $102_1$ is closed (i.e., switched "ON") to complete the port coupling, and an associated shunt switch $104_1$ coupled between the selected port and circuit ground is opened (i.e., switched "OFF"). Concurrently, the associated series switches $102_2$-$102_4$ for the other selectable ports RF2-RF4 are opened and their associated shunt switches $104_2$-$104_4$ are closed, thereby shunting each of the open ports to ground. The various series and shunt switches are opened or closed in similar fashion to couple any other selectable port RF2-RF4 to the RFC port. All of the switches are typically implemented as FETs on an integrated circuit (IC) die or "chip". Not shown is the conventional control circuitry for selecting and unselecting ports.

The closed shunt switches result in improved isolation of the switch 100 by shunting the open ports RF2-RF4 to ground; such a configuration results in short reflective unselected ports. However, a short reflective port RF switch 100 of the type shown in FIG. 1 is not suitable for all applications. In particular, such an architecture will short out the load impedance connected to an unselected port. The present invention addresses such shortcomings.

SUMMARY OF THE INVENTION

The present invention provides greater flexibility than the prior art by providing a switch with open reflective unselected ports at radio frequencies, and which may be alternatively configured as having either open or short reflective unselected ports. Embodiments of the present invention provide for open reflective unselected ports in an RF switch while keeping such ports protected from electrostatic discharges (ESD).

Embodiments of the invention includes an RF switch circuit which may be single or multiple pole, single or multiple-throw. Radio frequency signals can be selectively coupled between a common port and at least one selectable port. In operation, if a selectable port of the switch is selected to be coupled to the common port, then an associated series switch is closed to complete the port coupling. Concurrently, the associated series switches for the remaining selectable ports are opened. Associated switches from each of the selectable ports to ground are always open, regardless of the ON or OFF state of the series switches. In a sense, the switch as a whole is "shuntless" in normal operation as an RF switch since there is no normally active connection of the selectable ports to ground, or the switch as a whole may be considered to be "shuntable" since it is capable of conducting under breakdown conditions due to a voltage overload to deal with ESD and other overvoltage events. All of the switching elements are preferably implemented as FETs on an integrated circuit (IC) die or "chip".

An important aspect of the architecture of the inventive switch is that the shuntable switches for both the selected and unselected ports can be configured to be open at all times (i.e., switched "OFF"). This provides an open reflective termination (high impedance) for unselected ports, which is useful in impedance or aperture tuning applications. In addition, the presence of the shuntable switches provides ESD protection for all ports.

Embodiments of the present invention further allow configurability between a traditional short reflective unselected port architecture and the new open reflective unselected port architecture. Such configurability may be accomplished during integrated circuit manufacturing by applying a suitable interconnect mask, or after manufacturing by use of field configurable switch elements such as fusible links or additional active switching components.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention provides greater flexibility than the prior art by providing a switch with open reflective unselected ports at radio frequencies, and which may be alternatively configured as having either open or short reflective unselected ports. Embodiments of the present invention provide for open reflective unselected ports in an RF switch while keeping such ports protected from electrostatic discharges (ESD).

Embodiments of the present invention further allow configurability between a traditional short reflective unselected port architecture and the new open reflective unselected port architecture. Such configurability may be accomplished during integrated circuit manufacturing by applying a suitable interconnect mask (e.g., a metal layer mask), or after manufacturing by use of field configurable switch elements such as fusible links or additional active switching components.

Figure 1:
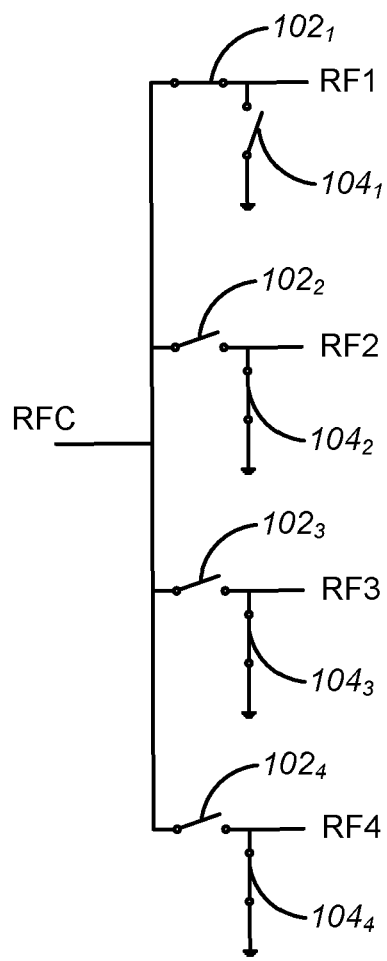
FIG. 1 is a schematic diagram of a typical prior art RF single-pole, multiple-throw switch circuit.
Figure 2A:
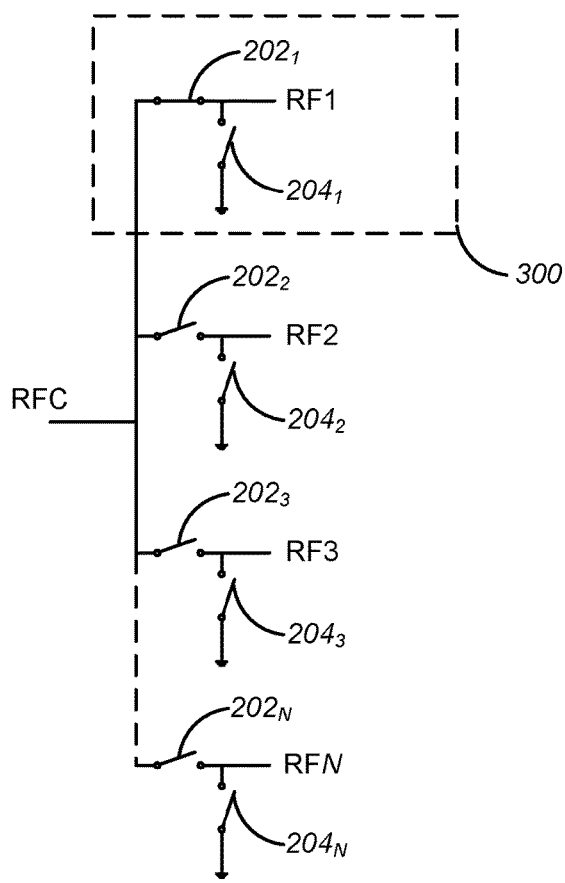
FIG. 2A is a schematic diagram of an example of an RF single-pole, multiple-throw switch circuit in accordance with the present invention.

FIG. 2A is a schematic diagram of an RF single-pole, multiple-throw switch circuit 200. Radio frequency signals can be selectively coupled between a common connection port RFC and at least one selectable RF port (N such ports, RF1-RFN, are shown). As in FIG. 1, the common connection port RFC is typically connected to an antenna or other RF circuitry (either directly or through additional circuitry, such as RF filters). The selectable RF ports RF1-RFN are typically used to connect the RFC port to other circuitry (not shown), such as RF transceivers (again, either directly or through additional circuitry).

In operation, if selectable port RF1 of the switch 200 is selected to be coupled to the RFC port, then an associated series switch $202_1$ is closed to complete the port coupling. Concurrently, the associated series switches $202_2$-$202_N$ for the remaining selectable ports RF2-RFN are opened. The various series switches are opened or closed in similar fashion to couple any other selectable port RF2-RFN to the RFC port (in some applications, more than one selectable port RF1-RFN may be coupled to the RFC port). However, in contrast to the prior art shown in FIG. 1, in the illustrated embodiment the associated switches $204_1$-$204_N$ between the selectable ports and ground are always open, regardless of the ON or OFF state of the series switches $202_1$-$202_N$. In a sense, the switch 200 as a whole is "shuntless" in normal operation as an RF switch since there is no normally active connection of the selectable ports to ground, or the switch as a whole may be considered to be "shuntable" since it is capable of conducting under breakdown conditions due to a voltage overload to deal with ESD and other overvoltage events, as described below. All of the switches are preferably implemented as FETs on an integrated circuit (IC) die or "chip".

An important aspect of the architecture of the switch 200 is that the switches $204_1$-$204_N$ for both the selected and unselected ports can be configured to be open at all times (i.e., switched "OFF"). This provides an open reflective termination (high impedance) for unselected ports, which is useful in impedance or antenna aperture tuning applications. In addition, the presence of the switches $204_1$-$204_N$ provides ESD protection for all ports, as explained in greater detail below.

Figure 2B:
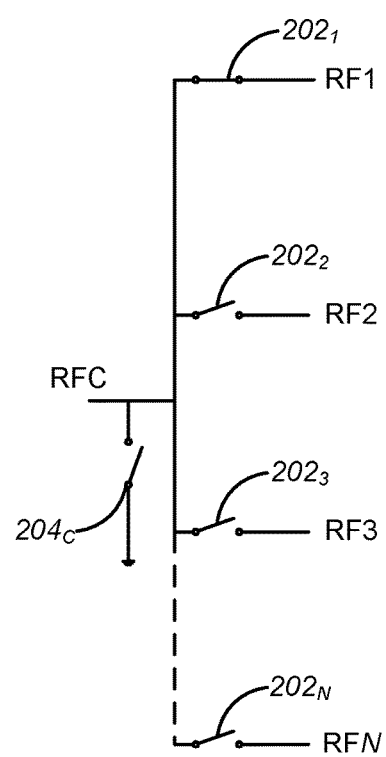
FIG. 2B is a schematic diagram of an example of an alternative RF single-pole, multiple-throw switch circuit in accordance with the present invention.

FIG. 2B is a schematic diagram of an example of an alternative RF single-pole, multiple-throw switch circuit 210 in accordance with the present invention. As in the example shown in FIG. 2A, RF signals can be selectively coupled between a common connection port RFC and at least one selectable RF port (N such ports, RF1-RFN, are shown). Each of the N selectable ports has an associated series switch $202_2$-$202_N$. In contrast to the example shown in FIG. 2B, rather than each selectable port having an associated shuntable switch $204_1$-$204_N$ between the selectable port and ground, only a single shuntable switch 204c is inserted, between the common port and ground.

In operation, if selectable port RF1 of the switch 210 is selected to be coupled to the RFC port, then an associated series switch $202_1$ is closed to complete the port coupling. Concurrently, the associated series switches $202_2$-$202_N$ for the remaining selectable ports RF2-RFN are opened. The various series switches are opened or closed in similar fashion to couple any other selectable port RF2-RFN to the RFC port (in some applications, more than one selectable port RF1-RFN may be coupled to the RFC port). Regardless of the ON or OFF state of the series switches $202_1$-$202_N$, the shuntable switch 204c between the common port and ground is always open, thus providing similar benefits (e.g., ESD protection) to the embodiment shown in FIG. 2A. As should be clear, the embodiment shown in FIG. 2B requires fewer component devices.

Figure 3:
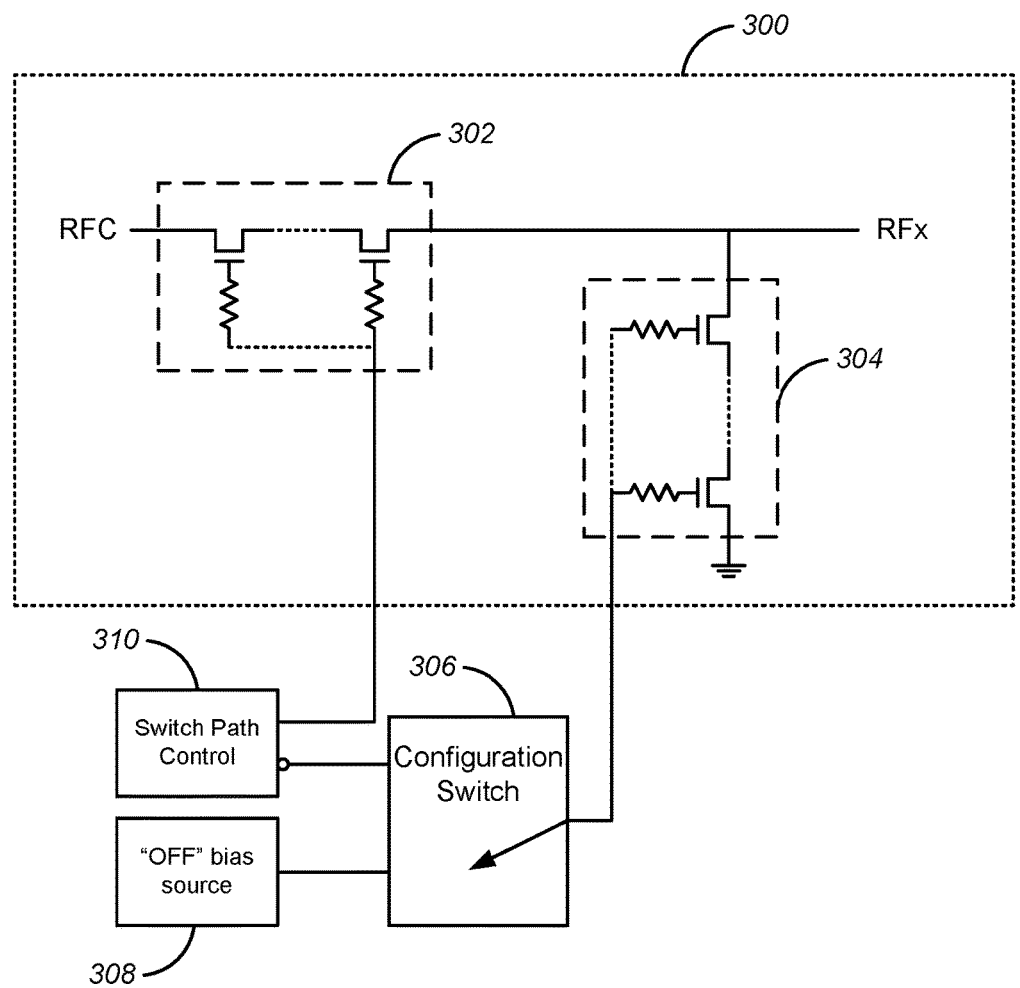
FIG. 3 is a schematic diagram of an individual RF switch circuit element in accordance with the present invention.

FIG. 3 is a schematic diagram of an individual RF port switch 300 (see dotted box in FIG. 2A) in accordance with the present invention. A series switch 302 from the common port RFC to a selectable port RFx is typically implemented with one or more series connected FETs (more FETs in series can handle a higher signal power level). A "shuntable" switch 304 from the selectable port RFx to ground may be implemented as one or more series connected FETs (again, more FETs in series can handle a higher signal power level). The number of component FETs (the series "stack height") for the series switch 302 need not be the same as the stack height of the shuntable switch 304. (Note that for the embodiment shown in FIG. 2A, the shuntable switch 304 would be positioned on the RFC port side of the series switch 302.)

For an open reflective configuration, a bias voltage is applied to the gates of the FETs of the shuntable switch 304 so that the FETs are in a permanent OFF state. Consequently, the unselected ports of the switch 300 maintain a high impedance at all times. The bias voltage will depend on the type of FET used in the circuit, and may be optimized for RF performance.

In addition, since a shuntable switch 304 is still electrically coupled between each port (selected and unselected) and ground, even if in an OFF state, a voltage on the associated port RFx in excess of the breakdown threshold of the switch 304 (e.g., an ESD event) will cause the switch 304 to conduct and shunt the voltage to ground. Accordingly, the inventive architecture will still protect each port from an overvoltage or ESD event.

The stack height of the shuntable switch 304 can be optimized for specific applications. If designed with more FETs in series, the shuntable switch 304 breakdown voltage threshold and RF power handling capability are higher and will contribute less harmonic content to the RF signal, while still protecting the port from an ESD event and providing an open-reflective impedance.

Also of note is that the design parameters (e.g., gate width, gate length, device type, doping levels, etc.) for the FETs in a shuntable switch 304 are more flexible than in the prior art architecture for many applications because the purpose of the shuntable switch 304 need not include isolation improvement per port (isolation improvement typically requires low resistance). In particular, the FET design parameters may be optimized for ESD protection performance.

Another benefit of the inventive architecture is that a single base IC design can be configured as either a traditional short reflective unselected port architecture or the new open reflective unselected port architecture. Such configurability may be accomplished during integrated circuit manufacturing by applying a suitable interconnect mask, such that each shuntable switch 304 is permanently biased to an OFF state, or in the alternative is coupled to conventional bias and control circuitry to behave as a traditional short reflective unselected port architecture.

Alternatively, embodiments of the invention may be configured after manufacturing by use of field configurable elements such as fusible links or by adding active switching components. For example, referring to FIG. 3, a configuration switch 306 coupled to the FET gates of a shuntable switch 304 may selectively couple the gates to a bias source 308 having a suitable voltage to permanently bias the shuntable switch 304 to an OFF state, thus conforming to an open reflective unselected port architecture. In the alternative, the configuration switch 306 couples the FET gates of the shuntable switch 304 to the inverse of a signal from a switch path control 310 applied to the series switch 302, so that the series switch 302 and the shuntable switch 304 always have the opposite conductive states. The switch path control 310 operates in known manner to select at least one port RFx to be coupled to the common port RFC. The resulting circuit thus will conform to a traditional short reflective unselected port architecture.

An additional benefit of the open reflective unselected port architecture is the improvement in harmonic performance due to lower voltage across each non-linear FET. In an RF switch 200 of the type shown in FIG. 2A, with the series and shuntable FET switches 302, 304 both OFF, the total OFF stack height is greater for the OFF branches, thus reducing voltage developed across each OFF FET and reducing the harmonic content on the RF signal. Further, the series and shuntable FET stacks can be optimized for insertion loss and harmonic performance in particular applications.

Figure 4:
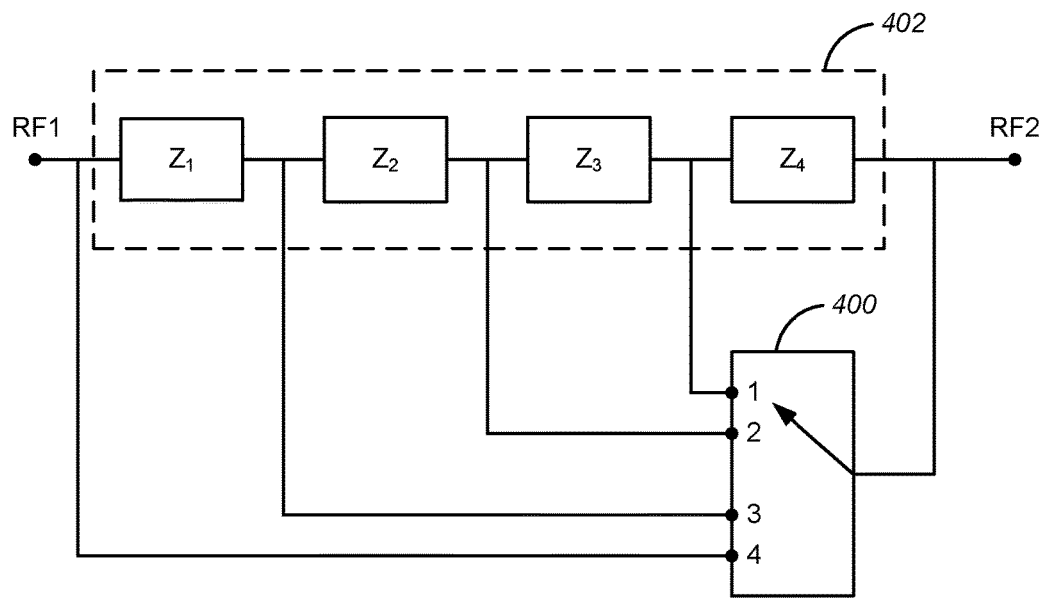
FIG. 4 is a schematic diagram of a series tuning application using an RF single-pole, multiple-throw switch circuit in accordance with the present invention.

Embodiments of the invention provide flexibility and utility not available with the prior art short reflective unselected port architecture. For example, FIG. 4 is a schematic diagram of a series tuning application using an RF single-pole, multiple-throw switch circuit 400 in accordance with the present invention. In this example, the input and output nodes of four impedance elements $Z_1$-$Z_4$ are series connected between ports RF1 and RF2. The input ports of a switch 400 in accordance with the present invention are coupled to the input/output nodes of the impedance elements as shown, in "front" of the respective impedance elements $Z_1$-$Z_4$ (i.e., on the RF1 side), with the common port connected to RF2. Depending on the switch position, the following states can be set (the 0 state means that all ports are isolated):

| State | Total Series Impedance (RF1 to RF2) |
|---|---|
| 0 | $Z_1 + Z_2 + Z_3 + Z_4$ |
| 1 | $Z_1 + Z_2 + Z_3$ |
| 2 | $Z_1 + Z_2$ |
| 3 | $Z_1$ |
| 4 | short |

This application requires a "shuntless" or "shuntable" architecture so that unselected ports maintain a high impedance and are not shorted to ground, as would be the case with a traditional switch of the type shown in FIG. 1. This application may be used, for example, to provide a variable impedance for tuning an RF circuit or antenna.

Figure 5:
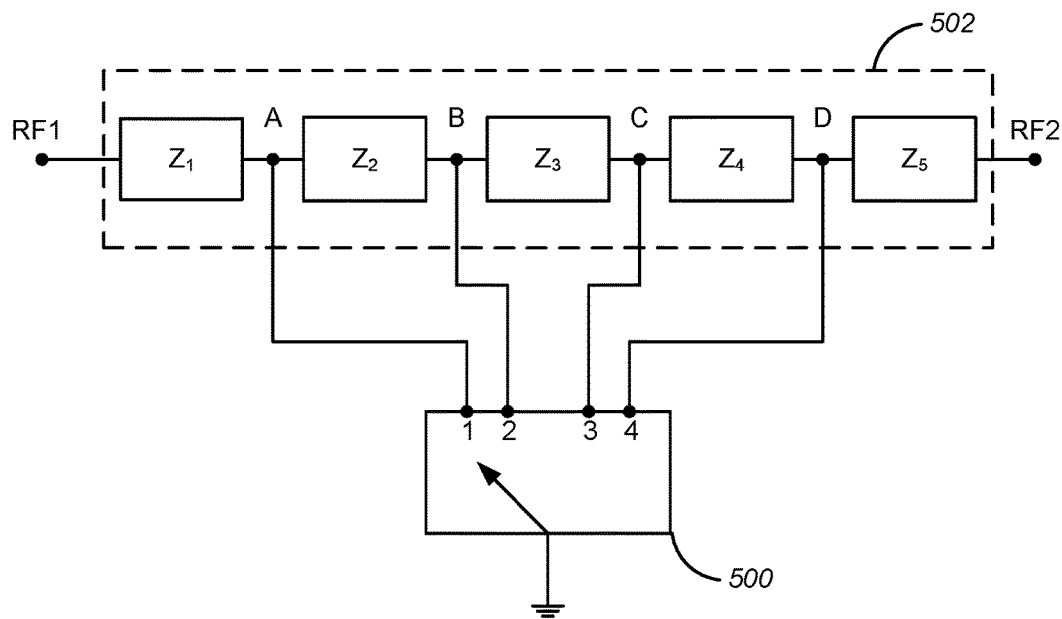
FIG. 5 is a schematic diagram of a first shunt tuning application using an RF single-pole, multiple-throw switch circuit in accordance with the present invention.

FIG. 5 is a schematic diagram of a first shunt tuning application using an RF single-pole, multiple-throw switch circuit 500 in accordance with the present invention. In this example, five impedance elements $Z_1$-$Z_5$ are series connected between ports RF1 and RF2. The input ports of a switch 500 in accordance with the present invention are coupled as shown to tapping points A-D between the respective impedance elements $Z_1$-$Z_5$, with the common port connected to ground. Depending on the switch position, the following states can be set:

| State | Node Shorted to Ground | Impedance seen from RF1 | Impedance seen from RF2 |
|---|---|---|---|
| 1 | A | $Z_1$ | $Z_2 + Z_3 + Z_4 + Z_5$ |
| 2 | B | $Z_1 + Z_2$ | $Z_3 + Z_4 + Z_5$ |
| 3 | C | $Z_1 + Z_2 + Z3$ | $Z_4 + Z_5$ |
| 4 | D | $Z_1 + Z_2 + Z_3 + Z_4$ | $Z_5$ |

This configuration may be used, for example, to select different tapping points A-D across the length of a transmission line or antenna structure. The switch 500 selectively connects tapping points to ground to change the electrical behavior of the circuit; the electrical behavior may be, for example, a resonant frequency or an impedance level. This application would not work with a traditional switch because all tapping points would be shorted to ground through the switch ports regardless of the switch state.

Figure 6:
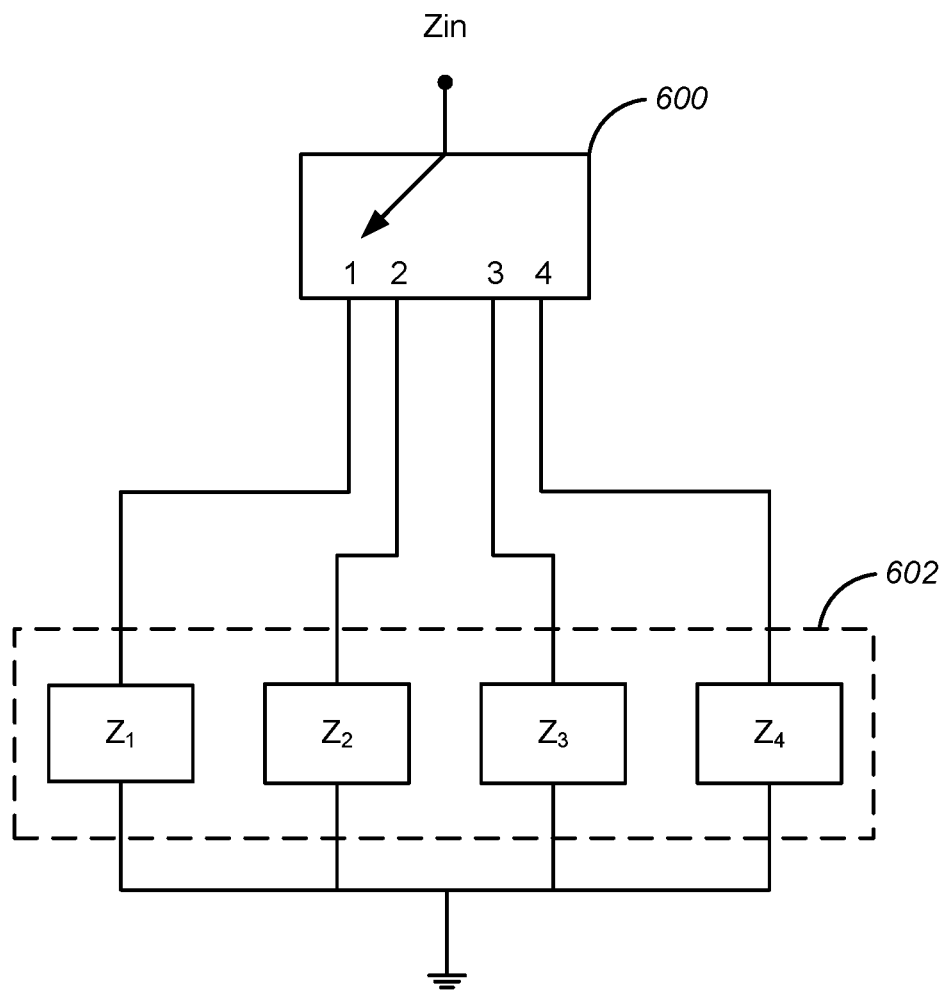
FIG. 6 is a schematic diagram of a second shunt tuning application using an RF single-pole, multiple-throw switch circuit in accordance with the present invention.

FIG. 6 is a schematic diagram of a second shunt tuning application using an RF single-pole, multiple-throw switch circuit in accordance with the present invention. In this example, four impedance elements $Z_1$-$Z_4$ are connected as shown through a switch 600 between an input Zin and ground. In particular, the input ports of a switch 500 in accordance with the present invention are coupled as shown to respective impedance elements $Z_1$-$Z_4$, with the common port comprising an input port, Zin. The total impedance seen looking into the common port can be varied based on the state of the switch, and will include the combined impedance of all termination impedances $Z_x$ plus the impedance Zoff of each of the unselected ports of the switch 600 itself. Depending on the switch position, the following states can be set for the selection of a single port at a time (the values shown assume that the impedance of the selected path is negligible; in some cases the path impedance may need to be taken into account):

| State | Zin Impedance |
|---|---|
| 0 | (Zoff + $Z_1$) ‖ (Zoff + $Z_2$) ‖ (Zoff + $Z_3$) ‖ (Zoff + $Z_4$) |
| 1 | $Z_1$ ‖ (Zoff + $Z_2$) ‖ (Zoff + $Z_3$) ‖ (Zoff + $Z_4$) |

-continued

| State | Zin Impedance |
|---|---|
| 2 | $(Zoff + Z_1) \| Z_2 \| (Zoff + Z_3) \| (Zoff + Z_4)$ |
| 3 | $(Zoff + Z_1) \| (Zoff + Z_2) \| Z_3 \| (Zoff + Z_4)$ |
| 4 | $(Zoff + Z_1) \| (Zoff + Z_2) \| (Zoff + Z_3) \| Z_4$ |

This configuration can be used, for example, to implement a digitally tunable reactance. This application would not work with a traditional switch because the impedances of all unselected ports would be shorted to ground in such switches. Note that the values shown in the above table will differ if two or more ports are selected to be coupled to the common port. Note also that while Zoff is assumed in the table above to be the same for each selectable port of the switch 600, that need not be the case—the Zoff value for each port can be different from other ports, and may be optimized for particular applications on a port by port basis.

In the examples shown in FIGS. 4-6, the $Z_i$ impedance elements may be any instance of or combination of capacitors, resistors, inductances, transmission lines, mutual inductance, filtering elements, etc., and may be integrated and/or external to the switch integrated circuit chip.

The example embodiments have been shown in the context of single-pole, multiple throw switches. However, the invention is similarly applicable to multiple-pole, multiple throw switches, to multiple pole, single throw switches, and to single pole, single throw switches.

In all of the examples shown in the accompanying figures, the switching and passive elements may be implemented in any suitable IC technology, including but not limited to MOSFET and IGFET semiconductor structures and microelectromechanical systems (MEMS). Integrated circuit embodiments may be fabricated using any suitable substrates and processes, including but not limited to standard bulk silicon, silicon-on-insulator (SOI), and silicon-on-sapphire (SOS) processes. Moreover, while the embodiments above have been described in the context of switching RF signals, the inventive architecture may be used in any application in which the permanent "OFF" state of the shuntable switch structure would be useful.

Another aspect of the invention includes a method for embodying a switch having open reflective unselected ports as an integrated circuit, including the steps of:

STEP 1: fabricating at least one series switch, each series switch being coupled to a common port and to an associated selectable port such that selection of at least one series switch electrically couples the common port to the selectable port associated with the selected series switch, and decouples the common port from all unselected selectable ports;

STEP 2: fabricating, for each series switch, an associated shuntable switch, each shuntable switch being coupled between ground and the selectable port associated with such associated series switch; and STEP 3: configuring each shuntable switch to be electrically non-conductive at all times to signals below a breakdown voltage threshold of such shuntable switch and electrically conductive to signals above such breakdown voltage threshold.

Another aspect of the invention includes a method for embodying a switch having open reflective unselected ports as an integrated circuit, including the steps of:

STEP 1: fabricating at least one series switch, each series switch being coupled to a common port and to an associated selectable port such that selection of at least one series switch electrically couples the common port to the selectable port associated with the selected series switch, and decouples the common port from all unselected selectable ports; and STEP 2: fabricating a shuntable switch coupled between ground and the common port, wherein such shuntable switch is configured to be electrically non-conductive at all times to signals below a breakdown voltage threshold of such shuntable switch and electrically conductive to signals above such breakdown voltage threshold.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A switching device having open reflective unselected ports, including:
    (a) at least one series switch, each series switch being coupled to a common port and to an associated selectable port such that selection of at least one series switch electrically couples the common port to the selectable port associated with each such selected series switch, and decouples the common port from all unselected selectable ports; and
    (b) for each series switch, an associated shuntable switch, each shuntable switch being coupled between a node and the selectable port associated with such series switch;
    wherein the shuntable switch for at least one selectable port is biased in a first mode of operation to be in a constant open state regardless of the open or closed state of the associated series switch, such that the at least one selectable port is in an open reflective configuration when unselected.

2. The switching device of claim 1, further including configuration and control circuitry, coupled to each shuntable switch, for selectively alternatively configuring the shuntable switch for at least one selectable port to be in a closed state in a second mode of operation, such that the at least one selectable port is in a short reflective configuration in such alternative configuration when unselected.

3. The switching device of claim 1, further including a shuntable switch coupled between a node and the common port, wherein such shuntable switch is in an open state.

4. The invention of claim 1, wherein at least one shuntable switch is conductive with respect to signals above a breakdown voltage threshold of such shuntable switch.

5. The invention of claim 1, wherein at least one shuntable switch comprises a plurality of series connected field effect transistors.

6. The invention of claim 1, wherein at least one shuntable switch comprises at least one field effect transistor (FET) having a gate, and wherein, in first mode of operation, a bias voltage is applied to the gate of each such FET so that such FETs are in a permanent OFF state.

7. An integrated circuit die for a switching device having open reflective unselected ports, including:
    (a) at least one series switch, each series switch being coupled to a common port and to an associated selectable port such that selection of at least one series switch electrically couples the common port to the selectable port associated with each selected series switch, and decouples the common port from all unselected selectable ports;
(b) for each series switch, an associated shuntable switch, each shuntable switch being coupled between a node and the selectable port associated with such associated series switch; and
(c) a configurable layout wherein at least one shuntable switch is selectively configurable by an interconnect mask to be either (1) configured to be in a constant open state regardless of the open or closed state of the associated series switch, such that at least one selectable port is in an open reflective configuration when unselected, or (2) configured to be selectively switchable to a closed state, such that at least one unselected selectable port is in a short reflective configuration when the at least one shuntable switch is in the closed state.

8. The integrated circuit die of claim 7, further including a shuntable switch coupled between a node and the common port, wherein such shuntable switch is in an open state.

9. A method for embodying a switching device having open reflective unselected ports as an integrated circuit, including the steps of:
(a) fabricating at least one series switch, each series switch being coupled to a common port and to an associated selectable port such that selection of at least one series switch electrically couples the common port to the selectable port associated with the selected series switch, and decouples the common port from all unselected selectable ports;
(b) fabricating, for each series switch, an associated shuntable switch, each shuntable switch being coupled between a node and the selectable port associated with such associated series switch; and
(c) configuring the shuntable switch for at least one selectable port to be in a constant open state regardless of the open or closed state of the associated series switch, such that the at least one selectable port is in an open reflective configuration when unselected.

10. The method of claim 9, further including the step of fabricating a shuntable switch coupled between a node and the common port, wherein such shuntable switch is in an open state.

11. The method of claim 9, wherein the step of configuring further includes alternatively configuring at least one shuntable switch to be in a closed state in a second mode of operation, such that at least one selectable port is in a short reflective configuration in such alternative configuration when unselected.

12. A switching device having open reflective unselected ports, including:
(a) at least one series switch, each series switch being coupled to a common port and to an associated selectable port such that selection of at least one series switch electrically couples the common port to the selectable port associated with each such selected series switch, and decouples the common port from all unselected selectable ports; and
(b) a shuntable switch coupled to a node and between the common port and the at least one series switch, wherein such shuntable switch is biased to be in a constant open state.

13. The switching device of claim 12, further including, for each series switch, an associated shuntable switch, each shuntable switch being coupled between a node and the selectable port associated with such associated series switch, wherein the shuntable switch for at least one selectable port is biased in a first mode of operation to be in a constant open state regardless of the open or closed state of the associated series switch, such that the at least one selectable port is in an open reflective configuration when unselected.

14. The switching device of claim 13, further including configuration and control circuitry, coupled to each shuntable switch, for selectively alternatively configuring the shuntable switch for at least one selectable port to be in a closed state in a second mode of operation, such that the at least one selectable port is in a short reflective configuration in such alternative configuration when unselected.

15. A method for embodying a switching device having open reflective unselected ports as an integrated circuit, including the steps of:
(a) fabricating at least one series switch, each series switch being coupled to a common port and to an associated selectable port such that selection of at least one series switch electrically couples the common port to the selectable port associated with the selected series switch, and decouples the common port from all unselected selectable ports; and
(b) fabricating a shuntable switch coupled to a node and between the common port and the at least one series switch, wherein such shuntable switch is biased to be in a constant open state.

16. The method of claim 15, further including the step of fabricating, for each series switch, an associated shuntable switch, each shuntable switch being coupled between a node and the selectable port associated with such associated series switch, wherein the shuntable switch for at least one selectable port is biased in a first mode of operation to be in a constant open state regardless of the open or closed state of the associated series switch, such that the at least one selectable port is in an open reflective configuration when selected.

17. The method of claim 15, further including alternatively configuring at least one shuntable switch to be in a closed state in a second mode of operation, such that at least one selectable port is in a short reflective configuration in such alternative configuration when unselected.

18. A series tuning circuit including:
(a) at least one series switch, each series switch being coupled to a common port and to an associated selectable port such that selection of at least one series switch electrically couples the common port to the selectable port associated with each such selected series switch, and decouples the common port from all unselected selectable ports;
(b) for each series switch, an associated shuntable switch, each shuntable switch being coupled between a node and the selectable port associated with such associated series switch, wherein the shuntable switch for at least one selectable port is configured to be biased in a first mode of operation to be in a constant open state such that the at least one selectable port is in an open reflective configuration when unselected; and
(c) a tuning element including one or more impedance elements coupled in series, each impedance element having an input node and an output node, and the tuning element having an input node and an output node, wherein the output node of the tuning element is coupled to the common port, the input node of the tuning element is coupled to a corresponding selectable port, and the input/output nodes between impedance elements within the tuning element are coupled to corresponding selectable ports.

19. A shunt tuning circuit including:
(a) at least one series switch, each series switch being coupled to a common port and to an associated selectable port such that selection of at least one series switch electrically couples the common port to the selectable port associated with each such selected series switch, and decouples the common port from all unselected selectable ports;
(b) for each series switch, an associated shuntable switch, each shuntable switch being coupled between a node and the selectable port associated with such associated series switch, wherein the shuntable switch for at least one selectable port is configured to be biased in a first mode of operation to be in a constant open state such that the at least one selectable port is in an open reflective configuration when unselected; and
(c) a tuning element including one or more impedance elements coupled in series, each impedance element having an input node and an output node, and the tuning element having an input node and an output node, wherein the common port is coupled to a node, and the input/output nodes between impedance elements within the tuning element are coupled to corresponding selectable ports.

20. A shunt tuning circuit including:
(a) at least one series switch, each series switch being coupled to a common port and to an associated selectable port such that selection of at least one series switch electrically couples the common port to the selectable port associated with each such selected series switch, and decouples the common port from all unselected selectable ports;
(b) for each series switch, an associated shuntable switch, each shuntable switch being coupled between a node and the selectable port associated with such associated series switch, wherein the shuntable switch for at least one selectable port is configured to be biased in a first mode of operation to be in a constant open state such that the at least one selectable port is in an open reflective configuration when unselected; and
(c) one or more impedance elements, each impedance element having an input node and an output node, wherein the input nodes of each impedance element are coupled to corresponding selectable ports, the output nodes of each impedance element are coupled to a node, and the common port is connectable to an input signal.

21. A series tuning circuit including:
(a) at least one series switch, each series switch being coupled to a common port and to an associated selectable port such that selection of at least one series switch electrically couples the common port to the selectable port associated with each such selected series switch, and decouples the common port from all unselected selectable ports;
(b) a shuntable switch coupled to a node and between the common port and the at least one series switch, wherein such shuntable switch is biased to be in a constant open state; and
(c) a tuning element including one or more impedance elements coupled in series, each impedance element having an input node and an output node, and the tuning element having an input node and an output node, wherein the output node of the tuning element is coupled to the common port, the input node of the tuning element is coupled to a corresponding selectable port, and the input/output nodes between impedance elements within the tuning element are coupled to corresponding selectable ports.

22. A shunt tuning circuit including:
(a) at least one series switch, each series switch being coupled to a common port and to an associated selectable port such that selection of at least one series switch electrically couples the common port to the selectable port associated with each such selected series switch, and decouples the common port from all unselected selectable ports;
(b) a shuntable switch coupled to a node and between the common port and the at least one series switch, wherein such shuntable switch is biased to be in a constant open state; and
(c) a tuning element including one or more impedance elements coupled in series, each impedance element having an input node and an output node, and the tuning element having an input node and an output node, wherein the common port is coupled to a node, and the input/output nodes between impedance elements within the tuning element are coupled to corresponding selectable ports.

23. A shunt tuning circuit including:
(a) at least one series switch, each series switch being coupled to a common port and to an associated selectable port such that selection of at least one series switch electrically couples the common port to the selectable port associated with each such selected series switch, and decouples the common port from all unselected selectable ports;
(b) a shuntable switch coupled to a node and between the common port and the at least one series switch, wherein such shuntable switch is biased to be in a constant open state; and
(c) one or more impedance elements, each impedance element having an input node and an output node, wherein the input nodes of each impedance element are coupled to corresponding selectable ports, the output nodes of each impedance element are coupled to a node, and the common port is connectable to an input signal.

* * * * *